(12) United States Patent
Koike (10) Patent No.: US 10,950,783 B2
(45) Date of Patent: Mar. 16, 2021

(54) MAGNETORESISTIVE ELEMENT AND MAGNETIC SENSOR

(71) Applicant: TDK CORPORATION, Tokyo (JP)

(72) Inventor: Hayato Koike, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/414,823

(22) Filed: May 17, 2019

(65) Prior Publication Data

US 2019/0296229 A1  Sep. 26, 2019

Related U.S. Application Data (63) Continuation of application No. 15/460,779, filed on Mar. 16, 2017, now Pat. No. 10,347,823.

(30) Foreign Application Priority Data

Mar. 30, 2016 (JP) ................ 2016-067817
Dec. 15, 2016 (JP) ................ 2016-243045

(51) Int. Cl.
*H01L 43/08* (2006.01)
*H01L 43/02* (2006.01)
*G01R 33/09* (2006.01)

(52) U.S. Cl.
CPC ............ *H01L 43/08* (2013.01); *G01R 33/093* (2013.01); *H01L 43/02* (2013.01)

(58) Field of Classification Search
CPC ..... H01L 43/08; G01R 33/093; G01R 33/098; G11B 2005/3996; G11B 5/3909
See application file for complete search history.

(56) References Cited

U.S. PATENT DOCUMENTS

| | | | |
|---|---|---|---|
| 7,209,328 B2 | 4/2007 | Ito et al. | |
| 8,085,513 B2 | 12/2011 | Sasaki | |
| 8,269,294 B2 | 9/2012 | Sasaki et al. | |
| 8,760,817 B2 | 6/2014 | Boone, Jr. et al. | |
| 9,117,465 B2 | 8/2015 | Kamiguchi et al. | |
| 2005/0002128 A1* | 1/2005 | Ito .................. | G11B 5/3932 360/324.2 |
| 2006/0056117 A1* | 3/2006 | Miyauchi ........... | G11B 5/3932 360/324.12 |
| 2006/0221511 A1* | 10/2006 | Saruki .............. | B82Y 10/00 360/324.2 |

(Continued)

FOREIGN PATENT DOCUMENTS

| | | |
|---|---|---|
| JP | 2004-342241 A | 12/2004 |
| JP | 2010-113788 A | 5/2010 |

(Continued)

*Primary Examiner* — Bradley Smith
*Assistant Examiner* — David J Goodwin
(74) *Attorney, Agent, or Firm* — Oliff PLC (57) ABSTRACT

A magnetoresistive element includes a channel layer, a first ferromagnetic layer, a second ferromagnetic layer, and a reference electrode. The first ferromagnetic layer, the second ferromagnetic layer, and the reference electrode are apart from each other and are electrically connected to each other through the channel layer. The average resistivity of a sixth region composed of a first region, a second region, and a fourth region is higher than the average resistivity of a seventh region composed of the second region, a third region, and a fifth region.

8 Claims, 7 Drawing Sheets

(56) References Cited

U.S. PATENT DOCUMENTS

| | | | |
|---|---|---|---|
| 2007/0076332 A1* | 4/2007 | Shoji | B82Y 25/00 360/324.12 |
| 2010/0119875 A1* | 5/2010 | Sasaki | G01R 33/093 428/812 |
| 2010/0296202 A1* | 11/2010 | Boone, Jr. | G01R 33/1284 360/313 |
| 2010/0314702 A1 | 12/2010 | Sasaki et al. | |
| 2012/0074510 A1* | 3/2012 | Sasaki | H01L 43/08 257/422 |
| 2012/0211848 A1* | 8/2012 | Sasaki | H01L 43/08 257/422 |
| 2013/0335847 A1* | 12/2013 | Shiroishi | G11B 5/02 360/46 |
| 2015/0029609 A1 | 1/2015 | Kamiguchi et al. | |
| 2016/0284982 A1* | 9/2016 | Sasaki | G01R 33/098 |
| 2017/0288133 A1 | 10/2017 | Koike | |

FOREIGN PATENT DOCUMENTS

| | | |
|---|---|---|
| JP | 2010-272199 A | 12/2010 |
| JP | 2010-287666 A | 12/2010 |
| JP | 2015-026741 A | 2/2015 |
| WO | 2015-076187 A1 | 5/2015 |

\* cited by examiner

MAGNETORESISTIVE ELEMENT AND MAGNETIC SENSOR

CROSS REFERENCE TO RELATED APPLICATION

This application is a continuation of U.S. application Ser. No. 15/460,779, filed Mar. 16, 2017, the contents of which are incorporated hereby by reference.

BACKGROUND OF THE INVENTION

1. Field of the Invention

The present invention relates to a magnetoresistive element and a magnetic sensor.

2. Description of the Related Art

Magnetoresistive elements are known as reproducing elements for use in thin-film magnetic recording/reproducing heads and the like. A common magnetoresistive element applies currents to a magnetization-fixed layer and a magnetization free layer, also applies a current between the magnetization-fixed layer and the magnetization free layer, and therefore provides a high output.

A spin accumulation magnetoresistive element is known to include a magnetization free layer and magnetization-fixed layer formed on the same horizontal surface (a channel layer for accumulating spins). In the case of using the spin accumulation magnetoresistive element in, for example, a magnetic sensor such as a thin-film magnetic recording/reproducing head, it is expected that high spatial resolution is obtained. Furthermore, the advantage that the degree of freedom in designing devices can be increased is expected. Japanese Unexamined Patent Application Publication No. 2010-287666 discloses a four-terminal spin accumulation magnetoresistive element including two ferromagnetic electrodes and two nonmagnetic electrodes. International Publication No. WO 2015/076187 discloses a three-terminal spin accumulation magnetoresistive element including two ferromagnetic electrodes and a nonmagnetic electrode.

However, the signal-to-noise ratio (S/N ratio) is still too small to commercialize spin accumulation magnetoresistive elements. Therefore, the S/N ratio needs to be increased.

SUMMARY OF THE INVENTION

It is an object of the present invention to provide a magnetoresistive element and magnetic sensor having a high S/N ratio.

In order to achieve the above object, a magnetoresistive element according to the present invention includes a channel layer, a first ferromagnetic layer, a second ferromagnetic layer, and a reference electrode. The first ferromagnetic layer, the second ferromagnetic layer, and the reference electrode are apart from each other and are electrically connected to each other through the channel layer. The first ferromagnetic layer, the second ferromagnetic layer, and the reference electrode do not overlap each other and are apart from each other when viewed in a thickness direction of the channel layer. The channel layer includes a first region that overlaps the first ferromagnetic layer when viewed in the thickness direction, a second region that overlaps the second ferromagnetic layer when viewed in the thickness direction, a third region that overlaps the reference electrode when viewed in the thickness direction, a fourth region located between the first region and the second region, and a fifth region located between the second region and the third region. The second region is located between the first region and the third region in the channel layer. The average resistivity of a sixth region composed of the first region, the second region, and the fourth region is higher than the average resistivity of a seventh region composed of the second region, the third region, and the fifth region.

This increases the ratio of the resistivity of the sixth region, which is a spin transport path, to the resistivity of the seventh region and reduces the ratio of the resistance of the seventh region, which is a spin detection path, to the resistance of the sixth region as compared to the case where the average resistivity of the sixth region is equal to the average resistivity of the seventh region. As the resistivity of the sixth region, which is the spin transport path, is higher, an output signal is larger. As the resistance of the seventh region, which is the spin detection path, is lower, output noise is smaller. Therefore, the magnetoresistive element according to the present invention is capable of having a high S/N ratio.

The magnetoresistive element according to the present invention further includes an eighth region in the fifth region, the average resistivity of the eighth region being higher than the average resistivity of the seventh region.

This allows the eighth region to function as a portion suppressing the diffusion of spins. Therefore, the eighth region can suppress the diffusion of spins accumulated in the second region in the direction from the second region to the third region and can densely accumulate spins in the second region. As a result, an output signal of the magnetoresistive element according to the present invention can be increased.

Furthermore, in the magnetoresistive element according the present invention, the second region is in contact with the eighth region.

This allows the effect of suppressing the diffusion of the spins accumulated in the second region in the direction from the second region to the third region by the eighth region to be further increased. Thus, an output signal of the magnetoresistive element according to the present invention can be increased.

A magnetoresistive element according to the present invention includes a channel layer, a first ferromagnetic layer, a second ferromagnetic layer, and a reference electrode. The first ferromagnetic layer and the second ferromagnetic layer are apart from each other and are electrically connected to each other through the channel layer. The reference electrode is placed on a side surface of the channel layer so as to be apart from the first ferromagnetic layer and the second ferromagnetic layer and is electrically connected to the first ferromagnetic layer and the second ferromagnetic layer through the channel layer. The first ferromagnetic layer, the second ferromagnetic layer, and the reference electrode do not overlap each other and are apart from each other when viewed in a thickness direction of the channel layer. The channel layer includes a first region that overlaps the first ferromagnetic layer when viewed in the thickness direction, a second region that overlaps the second ferromagnetic layer when viewed in the thickness direction, a third region located between the second region and the side surface on which the reference electrode is placed, and a fourth region located between the first region and the second region. The second region is located between the first region and the third region in the channel layer. The average resistivity of a fifth region composed of the first region, the second region, and the fourth region is higher than the average resistivity of a sixth region composed of the second region and the third region.

This increases the ratio of the resistivity of the fifth region, which is a spin transport path, to the resistivity of the sixth region and reduces the ratio of the resistance of the sixth region, which is a spin detection path, to the resistance of the fifth region as compared to the case where the average resistivity of the fifth region is equal to the average resistivity of the sixth region. As the resistivity of the fifth region, which is the spin transport path, is lower, an output signal is larger. As the resistance of the sixth region, which is a spin detection path, is lower, output noise is smaller. Therefore, the magnetoresistive element according to the present invention is capable of having a high S/N ratio.

The magnetoresistive element according to the present invention further includes a seventh region in the third region, the average resistivity of the seventh region being higher than the average resistivity of the sixth region.

This allows the seventh region to function as a portion suppressing the diffusion of spins. Therefore, the seventh region can suppress the diffusion of spins accumulated in the second region in the direction from the second region to the third region and can densely accumulate spins in the second region. As a result, an output signal of the magnetoresistive element according to the present invention can be increased.

Furthermore, in the magnetoresistive element according the present invention, the second region is in contact with the seventh region.

This allows the effect of suppressing the diffusion of the spins accumulated in the second region in the direction from the second region to the third region by the seventh region to be further increased. Thus, an output signal of the magnetoresistive element according to the present invention can be increased.

A magnetic sensor according to the present invention includes any one of the above-mentioned magnetoresistive elements.

This enables the magnetic sensor to have a high S/N ratio.

According to the present invention, a magnetoresistive element and magnetic sensor having a high S/N ratio can be provided.

DESCRIPTION OF THE PREFERRED EMBODIMENTS

Preferred embodiments of the present invention will now be described in detail with reference to the accompanying drawings. The present invention is not limited to the contents described in the embodiments below. Components described below include those that can be readily appreciated by those skilled in the art, substantially the same, and equivalents. Furthermore, the components can be appropriately combined with each other. The components can be omitted, replaced, or modified in various ways without departing from the scope of the present invention.

First Embodiment

A magnetoresistive element 1 according to a first embodiment is described below with reference to the accompanying drawings.

Basic Structure

Figure 1:
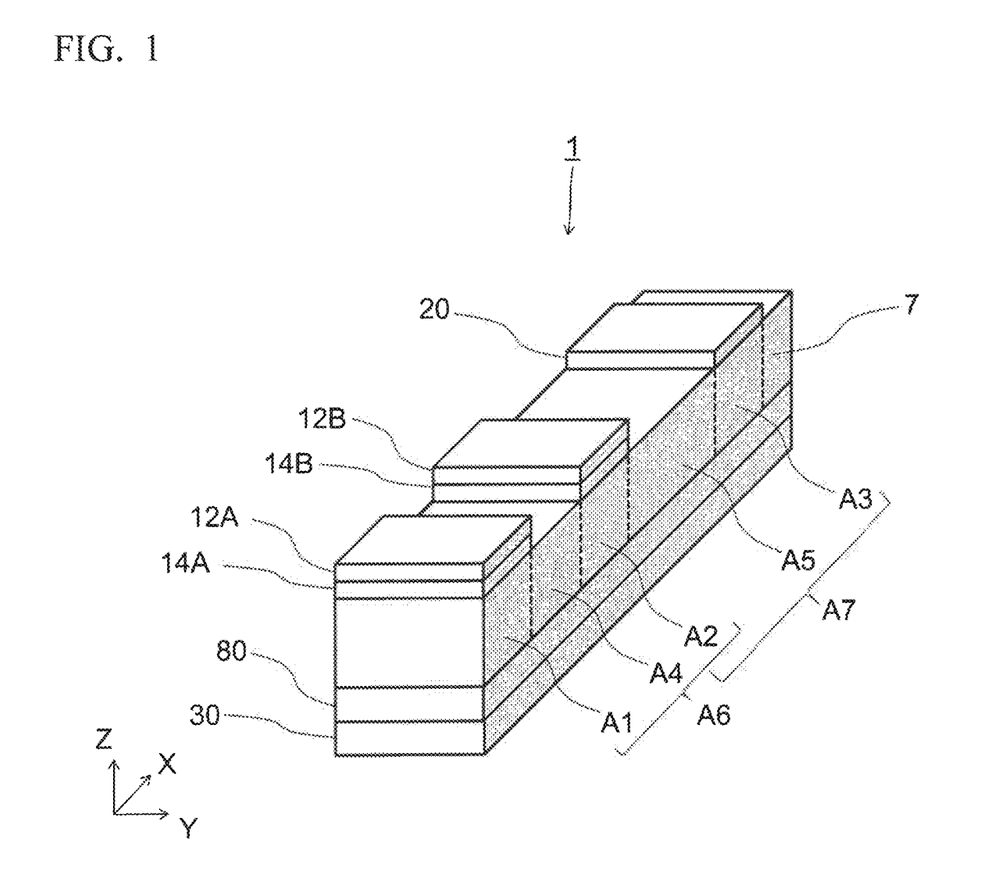
FIG. 1 is a perspective view of a magnetoresistive element according to a first embodiment.

FIG. 1 is a perspective view of the magnetoresistive element 1. As shown in FIG. 1, the magnetoresistive element 1 includes a channel layer 7, a first ferromagnetic layer 12A, a second ferromagnetic layer 12B, and a reference electrode 20. The channel layer 7 is placed above a support substrate 30 with a base insulating layer 80 therebetween. The first ferromagnetic layer 12A, the second ferromagnetic layer 12B, and the reference electrode 20 are placed on or above the upper surface of the channel layer 7 so as to be apart from each other and are electrically connected to each other through the channel layer 7. The first ferromagnetic layer 12A, the second ferromagnetic layer 12B, and the reference electrode 20 do not overlap each other and are apart from each other when viewed in a thickness direction of the channel layer 7. The second ferromagnetic layer 12B is located between the first ferromagnetic layer 12A and the reference electrode 20 on the channel layer 7. The channel layer 7 has a rectangular shape in plan view. A longitudinal direction of the rectangular shape is a direction (an in-plane direction) in which the first ferromagnetic layer 12A and the second ferromagnetic layer 12B are arranged. A lateral direction of the rectangular shape is a direction (an in-plane direction) perpendicular to the longitudinal direction thereof. The longitudinal direction of the rectangular shape is also a direction (an in-plane direction) in which the second ferromagnetic layer 12B and the reference electrode 20 are arranged.

The first ferromagnetic layer 12A and the second ferromagnetic layer 12B are portions between which spin-polarized carriers (electrons or holes) flow from the first ferromagnetic layer 12A to the second ferromagnetic layer 12B through the channel layer 7. The second ferromagnetic layer 12B and the reference electrode 20 are portions where the voltage is detected through the channel layer 7.

The channel layer 7 includes a first region A1 that overlaps the first ferromagnetic layer 12A when viewed in the thickness direction of the channel layer 7, a second region A2 that overlaps the second ferromagnetic layer 12B when viewed in the thickness direction of the channel layer 7, a third region A3 that overlaps the reference electrode 20 when viewed in the thickness direction of the channel layer 7, a fourth region A4 located between the first region A1 and the second region A2, and a fifth region A5 located between the second region A2 and the third region A3. In the channel layer 7, the second region A2 is located between the first region A1 and the third region A3. In the channel layer 7, the average resistivity of a sixth region A6 composed of the first region A1, the second region A2, and the fourth region A4 is higher than the average resistivity of a seventh region A7 composed of the second region A2, the third region A3, and the fifth region A5.

A first barrier layer 14A is placed between the first ferromagnetic layer 12A and the channel layer 7. A second barrier layer 14B is placed between the second ferromagnetic layer 12B and the channel layer 7.

Material Making Up Ferromagnetic Layers

Examples of a material making up the first and second ferromagnetic layers 12A and 12B include metals selected from the group consisting of Co, Fe, and Ni; alloys containing one or more selected from the group consisting of Cr, Mn, Co, Fe, and Ni; and alloys containing one or more selected from the group consisting of Cr, Mn, Co, Fe, and Ni and one or more selected from the group consisting of B, C, N, Al, Si, Ga, and Ge. In particular, the material making up the first and second ferromagnetic layers 12A and 12B is Co—Fe—B, Ni—Fe, or the like.

Barrier Layers

Since the first barrier layer 14A is placed between the first ferromagnetic layer 12A and the channel layer 7, many spin-polarized carriers (electrons or holes) can be injected into the channel layer 7 from the first ferromagnetic layer 12A and therefore an output signal of the magnetoresistive element 1 can be increased. Since the second barrier layer 14B is placed between the second ferromagnetic layer 12B and the channel layer 7, the reduction in spin polarization of spin-polarized carriers between the second ferromagnetic layer 12B and the channel layer 7 can be suppressed and therefore spins can be efficiently transported from the first ferromagnetic layer 12A to the second ferromagnetic layer 12B.

The first and second barrier layers 14A and 14B are preferably tunnel barrier layers. For example, magnesium oxide, aluminum oxide, titanium oxide, a spinel oxide film, zinc oxide, or the like can be used as a material making up the tunnel barrier layers. From the viewpoint of suppressing the increase of resistance to allow the tunnel barrier layers to function, the thickness of the tunnel barrier layers is preferably 3 nm or less. In consideration of the thickness of a monoatomic layer, the thickness of the tunnel barrier layers is preferably 0.4 nm or more.

Material Making Up Reference Electrode

A material making up the reference electrode 20 is preferably a nonmagnetic material, particularly a nonmagnetic metal. Examples of the material making up the reference electrode 20 include metal materials such as Cu, Au, Pt, Ta, Cr, and Al.

Channel Layer

The channel layer 7 is a layer in which spins are transported or are accumulated. A material making up the channel layer 7 is preferably a nonmagnetic material with a long spin diffusion length. In the magnetoresistive element 1, the material making up the channel layer 7 is a nonmagnetic semiconductor. In this case, the material (base material) making up the channel layer 7 may be a semiconductor including any one of Si, Ge, GaAs, and C. In the magnetoresistive element 1, the base material making up the channel layer 7 is common to the first to fifth regions A1 to A5 (the first region A1, the second region A2, the third region A3, the fourth region A4, and the fifth region A5) (common to the sixth region A6 and the seventh region A7). The average impurity concentration (carrier concentration) of the sixth region A6 is lower than the average impurity concentration (carrier concentration) of the seventh region A7. This allows the average resistivity of the sixth region A6 to be higher than the average resistivity of the seventh region A7. In particular, the average impurity concentration (carrier concentration) of the first region A1, the average impurity concentration (carrier concentration) of the second region A2, and the average impurity concentration (carrier concentration) of the fourth region A4 are lower than the average impurity concentration (carrier concentration) of the third region A3 and the average impurity concentration (carrier concentration) of the fifth region A5. The average resistivity of the first region A1, the average resistivity of the second region A2, and the average resistivity of the fourth region A4 are higher than the average resistivity of the third region A3 and the average resistivity of the fifth region A5. From the viewpoint of obtaining a high S/N ratio, the average resistivity of the sixth region A6 is preferably, for example, greater than $1 \times 10^{-4}$ Ω·m to less than $1 \times 10^{-2}$ Ω·m and the average resistivity of the seventh region A7 is preferably, for example, greater than $5 \times 10^{-5}$ Ω·m to less than $1 \times 10^{-4}$ Ω·m. When the material making up the channel layer 7 is Si, the average impurity concentration (carrier concentration) of the sixth region A6 is preferably, for example, greater than $1 \times 10^{16}$ cm$^{-3}$ to less than $1 \times 10^{19}$ cm$^{-3}$ and the average impurity concentration (carrier concentration) of the seventh region A7 is preferably, for example, greater than $1 \times 10^{19}$ cm$^{-3}$ to less than $5 \times 10^{20}$ cm$^{-3}$.

In the case of using the nonmagnetic semiconductor as the material making up the channel layer 7, the resistivity can be adjusted by doping a semiconductor material serving as a base material with a small amount of an impurity (impurity doping). Examples of an impurity doping process include an ion implantation process and a thermal diffusion process. When the semiconductor material, which serves as a base material, is a group 14 (Group IV) element such as Si, Ge, or C, doping the semiconductor material with a group 15 (Group V) element such as N, P, As, or Sb in the form of an impurity allows electrons to be majority carriers and therefore the carrier concentration, that is, the electron concentration can be adjusted and the resistivity can be adjusted. In this case, the channel layer 7 is made of an n-type semiconductor. Alternatively, doping the semiconductor material with a group 13 (Group III) element such as B, Al, or Ga in the form of an impurity allows holes to be majority carriers and therefore the carrier concentration, that is, the hole concentration can be adjusted and the resistivity can be adjusted. In this case, the channel layer 7 is made of a p-type semiconductor.

In order to allow the average resistivity of the sixth region A6 to be higher than the average resistivity of the seventh region A7, the magnetoresistive element 1 is preferably prepared by, for example, a procedure below.

A base plate including the support substrate 30, the base insulating layer 80, and a nonmagnetic semiconductor layer is prepared. The nonmagnetic semiconductor layer is doped with an impurity at a desired concentration in advance.

Next, deposits (particles, organic matter, native oxides, and the like) on the surface of the nonmagnetic semiconductor layer are removed by chemical cleaning, a plasma treatment, or the like, whereby the surface of the nonmagnetic semiconductor layer is cleaned and is planarized.

Next, a barrier layer and a ferromagnetic layer are formed on the nonmagnetic semiconductor layer by a molecular beam epitaxy (MBE) process or the like, whereby a stack is prepared.

Next, the stack is patterned by photolithography, ion milling, and the like so as to have a rectangular shape, whereby a structure in which the barrier layer and the ferromagnetic layer are stacked on an upper portion of the nonmagnetic semiconductor layer is prepared.

Next, the barrier layer and ferromagnetic layer of the above structure are patterned by photolithography, ion milling, and the like, whereby the first barrier layer 14A, the first ferromagnetic layer 12A, the second barrier layer 14B, and the second ferromagnetic layer 12B are formed. This prepares a structure in which the first barrier layer 14A and the first ferromagnetic layer 12A are stacked on an upper portion of a region of the nonmagnetic semiconductor layer, the region corresponding to the first region A1; the second barrier layer 14B and the second ferromagnetic layer 12B are stacked on an upper portion of a region of the nonmagnetic semiconductor layer, the region corresponding to the second region A2; and upper portions of the nonmagnetic semiconductor layer that exclude the regions of the nonmagnetic semiconductor layer that correspond to the first and second regions A1 and A2 are exposed.

Next, an upper portion of a region of the nonmagnetic semiconductor layer, the region corresponding to the first, second, and fourth regions A1, A2, and A4 (the sixth region A6), is covered with a masking material such as a photoresist by photolithography and portions of the nonmagnetic semiconductor layer that are not covered by the masking material are additionally doped with an impurity, whereby the channel layer 7 is prepared. This allows the average impurity concentration of a portion of the channel layer 7, the portion excluding the sixth region A6, to be higher than the average impurity concentration of the sixth region A6.

Finally, the reference electrode 20 is formed on the upper surface of the channel layer 7 by photolithography, a sputtering process, and the like. In the magnetoresistive element 1 prepared in this way, a side surface of the channel layer 7, a side surface of the first ferromagnetic layer 12A, a side surface of the second ferromagnetic layer 12B, and a side surface of the reference electrode 20 (surfaces along a direction in which the first ferromagnetic layer 12A, the second ferromagnetic layer 12B, and the reference electrode 20 are arranged) are present on the same plane.

In the channel layer 7 prepared in this way, the average resistivity (or impurity concentration) of the first region A1, the average resistivity (or impurity concentration) of the second region A2, and the average resistivity (or impurity concentration) of the fourth region A4 are substantially equal to each other and the average resistivity (or impurity concentration) of the third region A3 is substantially equal to the average resistivity (or impurity concentration) of the fifth region A5.

In the channel layer 7, the distance from the first ferromagnetic layer 12A to the second ferromagnetic layer 12B is preferably less than or equal to the spin diffusion length of the material making up the channel layer 7.

When the material making up the channel layer 7 is the n-type semiconductor, electrons are spin-polarized carriers. In this case, the current flowing from the second ferromagnetic layer 12B to the first ferromagnetic layer 12A through the channel layer 7 is applied from the first ferromagnetic layer 12A and the second ferromagnetic layer 12B. In this case, electrons spin-polarized by the first ferromagnetic layer 12A are injected from the first ferromagnetic layer 12A and are transported in the channel layer 7 in the direction from the first ferromagnetic layer 12A to the second ferromagnetic layer 12B. This causes the non-equilibrium state of spins (spin accumulation) in an inner portion (the sixth region A6) of the channel layer 7.

When the material making up the channel layer 7 is the p-type semiconductor, holes are spin-polarized carriers. In this case, the current flowing from the first ferromagnetic layer 12A to the second ferromagnetic layer 12B through the channel layer 7 is applied from the first ferromagnetic layer 12A and the second ferromagnetic layer 12B. In this case, holes spin-polarized by the first ferromagnetic layer 12A are injected from the first ferromagnetic layer 12A and are transported in the channel layer 7 in the direction from the first ferromagnetic layer 12A to the second ferromagnetic layer 12B. This causes the non-equilibrium state of spins (spin accumulation) in the inner portion (the sixth region A6) of the channel layer 7.

Since spin-polarized carriers are transported in the direction from the first ferromagnetic layer 12A to the second ferromagnetic layer 12B and therefore the non-equilibrium state of spins (spin accumulation) is caused in the sixth region A6 as described above, a magnetoresistive effect due to the magnetization of the first and second ferromagnetic layers 12A and 12B is produced in the magnetoresistive element 1 and the resistance change corresponding to the change of the relative angle between the magnetization direction of the first ferromagnetic layer 12A and the magnetization direction of the second ferromagnetic layer 12B is caused.

In the channel layer 7, the second region A2, which is a region that overlaps the second ferromagnetic layer 12B when viewed in the thickness direction of the channel layer 7, is located between the first region A1 (a region that overlaps the first ferromagnetic layer 12A when viewed in the thickness direction of the channel layer 7) and the third region A3 (a region that overlaps the reference electrode 20 when viewed in the thickness direction of the channel layer 7). Therefore, among the above resistance changes, the voltage change (output value) mainly corresponding to the resistance change due to a magnetoresistive effect between the second ferromagnetic layer 12B and the second region A2 of the channel layer 7 is detected between the second ferromagnetic layer 12B and the reference electrode 20 through the channel layer 7 (the seventh region A7).

Other Materials

Examples of a material making up the support substrate 30 include Al—Ti—C and Si. Examples of a material making up the base insulating layer 80, which is placed on the support substrate 30, include $SiO_x$ (silicon oxide), $HfO_x$ (hafnium oxide), and $SiN_x$ (silicon nitride).

Description of Effects

In the magnetoresistive element 1, the average resistivity of the sixth region A6 is higher than the average resistivity of the seventh region A7. Thus, the ratio of the resistivity of the sixth region A6, which is a spin transport path, to the resistivity of the seventh region A7 increases and the ratio of the resistance of the seventh region A7, which is a spin detection path, to the resistance of the sixth region A6 decreases as compared to the case where the average resistivity of the sixth region A6 is equal to the average resistivity of the seventh region A7.

Spin-polarized carriers (electrons or holes) are transported under the influence of the electric field (drift electric field) induced in the sixth region A6 by the voltage applied between the first ferromagnetic layer 12A and the second ferromagnetic layer 12B for the purpose of passing a current through the channel layer 7 (the sixth region A6).

In the case where the n-type semiconductor is used as the material making up the channel layer 7 and a voltage is applied in the spin transport path such that the second ferromagnetic layer 12B is positive and the first ferromagnetic layer 12A is negative, a current flows from the second ferromagnetic layer 12B to the first ferromagnetic layer 12A through the channel layer 7 and an electric field is induced in the sixth region A6 such that the second region A2 side is positive and the first region Al side is negative. In this case, electrons spin-polarized by the first ferromagnetic layer 12A are injected from the first ferromagnetic layer 12A and are transported to the second ferromagnetic layer 12B through the channel layer 7 (the sixth region A6). In the inside of the sixth region A6, the force (drift electric field) to transport the spin-polarized electrons by accelerating the spin-polarized electrons in the same direction as the direction in which the spin-polarized electrons flow is applied to the spin-polarized electrons. The intensity of the drift electric field is given by the product of the resistivity of the sixth region A6, which is the spin transport path, and the current density in the sixth region A6. Therefore, when the current applied between the first ferromagnetic layer 12A and the second ferromagnetic layer 12B is constant, as the resistivity of the sixth region A6 is higher, the intensity of the drift electric field is higher. This allows the spin-polarized electrons to be densely accumulated in the second region A2. As a result, the magnetoresistive effect between the second ferromagnetic layer 12B and the second region A2 increases and an output signal detected between the second ferromagnetic layer 12B and the reference electrode 20 increases.

In the case where the p-type semiconductor is used as the material making up the channel layer 7 and a voltage is applied in the spin transport path such that the first ferromagnetic layer 12A is positive and the second ferromagnetic layer 12B is negative, a current flows from the first ferromagnetic layer 12A to the second ferromagnetic layer 12B through the channel layer 7 and an electric field is induced in the sixth region A6 such that the first region A1 side is positive and the second region A2 side is negative. In this case, hole spin-polarized by the first ferromagnetic layer 12A are injected from the first ferromagnetic layer 12A and are transported to the second ferromagnetic layer 12B through the channel layer 7 (the sixth region A6). In the inside of the sixth region A6, the force (drift electric field) to transport the spin-polarized holes by accelerating the spin-polarized holes in the same direction as the direction in which the spin-polarized holes flow is applied to the spin-polarized holes. In common with the case where the material making up the channel layer 7 is the n-type semiconductor, the intensity of the drift electric field is given by the product of the resistivity of the sixth region A6, which is the spin transport path, and the current density in the sixth region A6. Therefore, when the current applied between the first ferromagnetic layer 12A and the second ferromagnetic layer 12B is constant, as the resistivity of the sixth region A6 is higher, the intensity of the drift electric field is higher. This allows the spin-polarized holes to be densely accumulated in the second region A2. As a result, the magnetoresistive effect between the second ferromagnetic layer 12B and the second region A2 increases and an output signal detected between the second ferromagnetic layer 12B and the reference electrode 20 increases.

Furthermore, as the resistivity of the seventh region A7, which is the spin detection path (voltage detection path), is lower, the resistance in the voltage detection path is lower. As a result, output noise in the voltage detection path decreases. Thus, the magnetoresistive element 1 is capable of having a high S/N ratio.

In the magnetoresistive element 1, the average resistivity (or impurity concentration) of the second region A2 is substantially equal to the average resistivity (or impurity concentration) of the first region A1 and the average resistivity (or impurity concentration) of the fourth region A4. The average impurity concentration of the second region A2 may be higher than the average impurity concentration of the first region A1 and the average impurity concentration of the fourth region A4. The average resistivity of the second region A2 may be lower than the average resistivity of the first region A1 and the average resistivity of the fourth region A4. In this case, the average resistivity of the third region A3 and the average resistivity of the fifth region A5 need not be lower than the average resistivity of the second region A2 and may be substantially equal to the average resistivity of the second region A2 (the average impurity concentration of the third region A3 and the average impurity concentration of the fifth region A5 need not be higher than the average impurity concentration of the second region A2 and may be substantially equal to the average impurity concentration of the second region A2). In this case, though the effect of increasing an output signal by the drift electric field in the second region A2, which is a portion of the spin transport path, is less as compared to the magnetoresistive element 1, the resistance of the spin detection path is lower as compared to the magnetoresistive element 1 and output noise decreases. Thus, in this case, a high S/N ratio is obtained because the average resistivity of the sixth region A6 is higher than the average resistivity of the seventh region A7.

Even when there is a resistivity gradient in each region (the first region A1, the second region A2, the third region A3, the fourth region A4, or the fifth region A5) of the channel layer 7, the magnetoresistive element 1 exhibits a similar effect. In order to reduce, for example, the average resistivity of the seventh region A7, only an upper portion (the reference electrode 20 side) of the third region A3 and the an upper portion of the fifth region A5 may be heavily doped with an impurity.

In the first embodiment, the following example has been described: an example in which the first ferromagnetic layer 12A, the second ferromagnetic layer 12B, and the reference electrode 20 are placed on the upper surface side of the channel layer 7. At least one of the first ferromagnetic layer 12A, the second ferromagnetic layer 12B, and the reference electrode 20 may be placed on the lower surface side of the channel layer 7.

Figure 2:
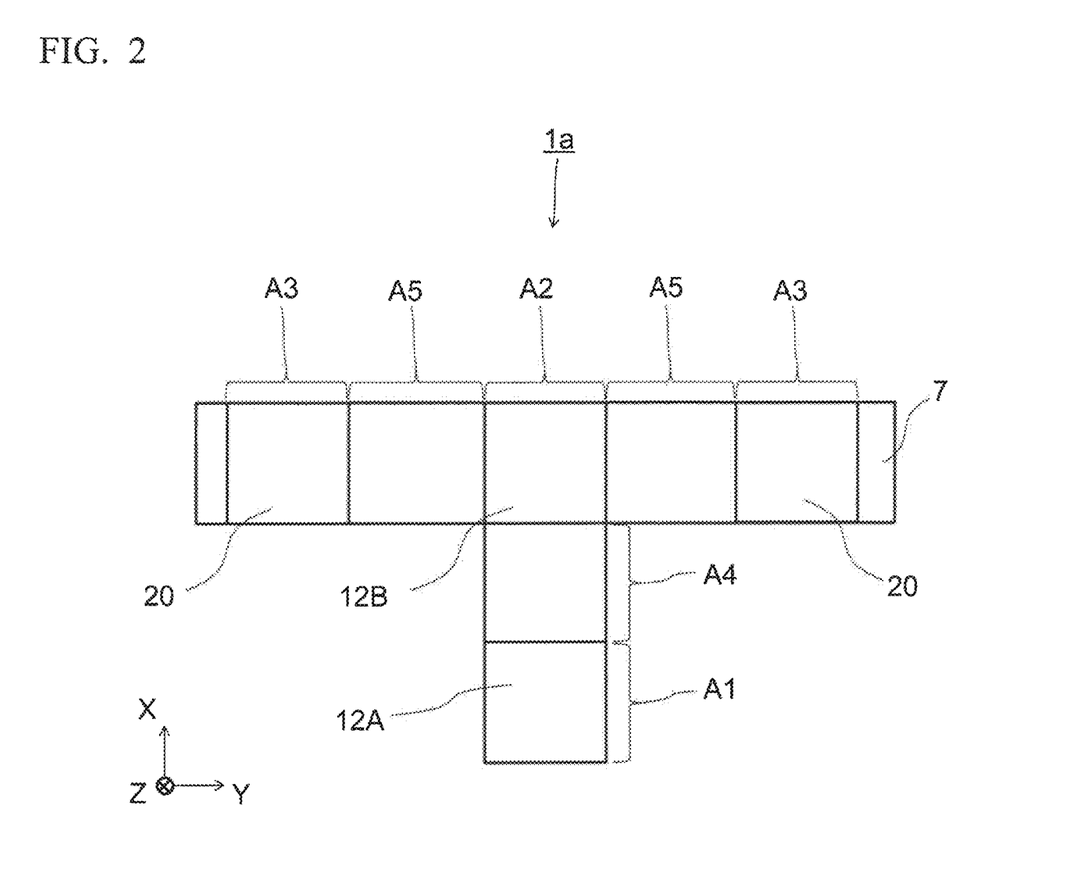
FIG. 2 is a top view of a modification of the magnetoresistive element according to the first embodiment.

In the first embodiment, the following example has been described: an example in which the channel layer 7 has the rectangular shape in plan view. The channel layer 7 may have a shape having at least one bent portion (for example, an L-shape or a T-shape) in plan view. FIG. 2 is a top view of a magnetoresistive element 1a including a channel layer 7 with a T-shape in plan view. As shown in FIG. 2, in this magnetoresistive element 1a, this channel layer 7 branches into a T-shape in a second region A2 (a region that overlaps a second ferromagnetic layer 12B when viewed in a thickness direction) and two reference electrodes 20, two third regions A3, and two fifth regions A5 are arranged. In this magnetoresistive element 1a, this second region A2 is located between a first region A1 and these third regions A3 in this seventh region A7.

Second Embodiment

A magnetoresistive element 2 according to a second embodiment is described below. Differences from the magnetoresistive element 1 according to the first embodiment are mainly described and common items will not be described in detail.

Figure 3:
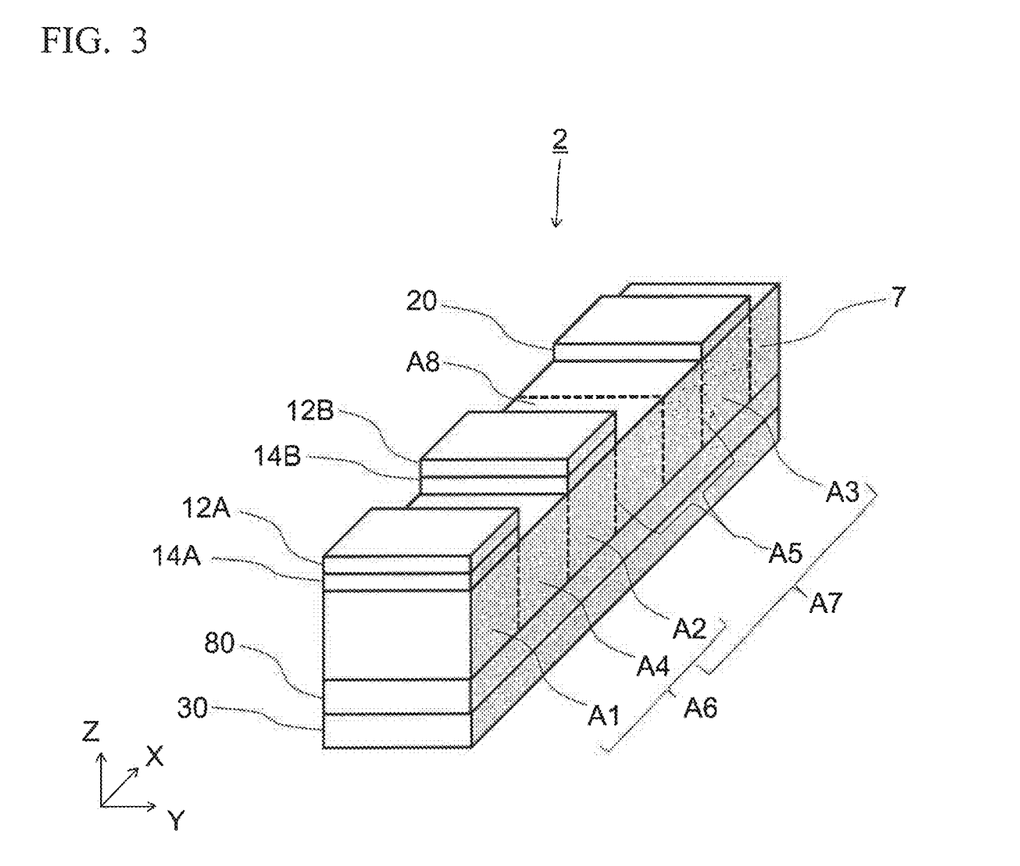
FIG. 3 is a perspective view of a magnetoresistive element according to a second embodiment.

The magnetoresistive element 2 differs from the magnetoresistive element 1 according to the first embodiment in the configuration of a fifth region A5. As shown in FIG. 3, the magnetoresistive element 2 includes an eighth region A8 in the fifth region A5, the average resistivity of the eighth region A8 being higher than the average resistivity of the seventh region A7. The average impurity concentration of the eighth region A8 is lower than the average impurity concentration of the seventh region A7. As shown in FIG. 3, in the magnetoresistive element 2, the second region A2 is in contact with the eighth region A8. Other components of the magnetoresistive element 2 are the same as those of the magnetoresistive element 1 according to the first embodiment.

In the first embodiment, the following example has been described: an example in which the channel layer 7 is prepared in such a manner that the upper portion of the region of the nonmagnetic semiconductor layer that corresponds to the first, second, and fourth regions A1, A2, and A4 (the sixth region A6) is covered with the masking material, such as the photoresist, and the portions of the nonmagnetic semiconductor layer that are not covered by the masking material are additionally doped with the impurity. In the preparation of the magnetoresistive element 2, the channel layer 7 is prepared in such a manner that, for example, upper portions of regions of the nonmagnetic semiconductor layer, the regions corresponding to a sixth region A6 (a first region A1, a second region A2, and a fourth region A4) and the eighth region A8, are covered with the masking material, such as the photoresist, and a portion of the nonmagnetic semiconductor layer that is not covered by the masking material is additionally doped with the impurity. The magnetoresistive element 2 can be prepared as described above.

In the channel layer 7 prepared in this way, the average resistivity (or impurity concentration) of the first region A1, the average resistivity (or impurity concentration) of the second region A2, the average resistivity (or impurity concentration) of the fourth region A4, and the average resistivity (or impurity concentration) of the eighth region A8 are substantially equal to each other and the average resistivity (or impurity concentration) of the third region A3 is substantially equal to the average resistivity (or impurity concentration) of a region excluding the eighth region A8 from the fifth region A5.

The magnetoresistive element 2 includes the eighth region A8, of which the average resistivity is higher than the average resistivity of the seventh region A7, in the fifth region A5 as described above. Spins accumulated in the second region A2 have the property of diffusing in a region with low resistivity. Since the eighth region A8 functions as a portion suppressing the diffusion of spins, the eighth region A8 can suppress the diffusion of the spins accumulated in the second region A2 in the direction from second region A2 to the third region A3 and can densely accumulate spins in the second region A2. As a result, an output signal of the magnetoresistive element 2 can be increased.

Furthermore, in the magnetoresistive element 2, the second region A2 is in contact with the eighth region A8 and therefore the effect of suppressing the diffusion of the spins accumulated in the second region A2 in the direction from the second region A2 to the third region A3 by the eighth region A8 can be further increased. Thus, an output signal of the magnetoresistive element 2 can be further increased.

In the magnetoresistive element 2, the whole of the third region A3 and the whole of the region excluding the eighth region A8 from the fifth region A5 are additionally doped with the impurity and therefore these regions have low resistivity (high impurity concentration). For example, only a portion of the region excluding the eighth region A8 from the fifth region A5 may be additionally doped with the impurity such that only this portion has low resistivity (high impurity concentration).

In the magnetoresistive element 2, the second region A2 is in contact with the eighth region A8. The second region A2 may be apart from the eighth region A8. Even in this case, the effect of suppressing the diffusion of the spins accumulated in the second region A2 in the direction from the second region A2 to the third region A3 by the eighth region A8 is obtained and an output signal of the magnetoresistive element 2 can be increased.

Third Embodiment

A magnetoresistive element 3 according to a third embodiment is described below. Differences from the magnetoresistive element 1 according to the first embodiment are mainly described and common items will not be described in detail.

Figure 4:
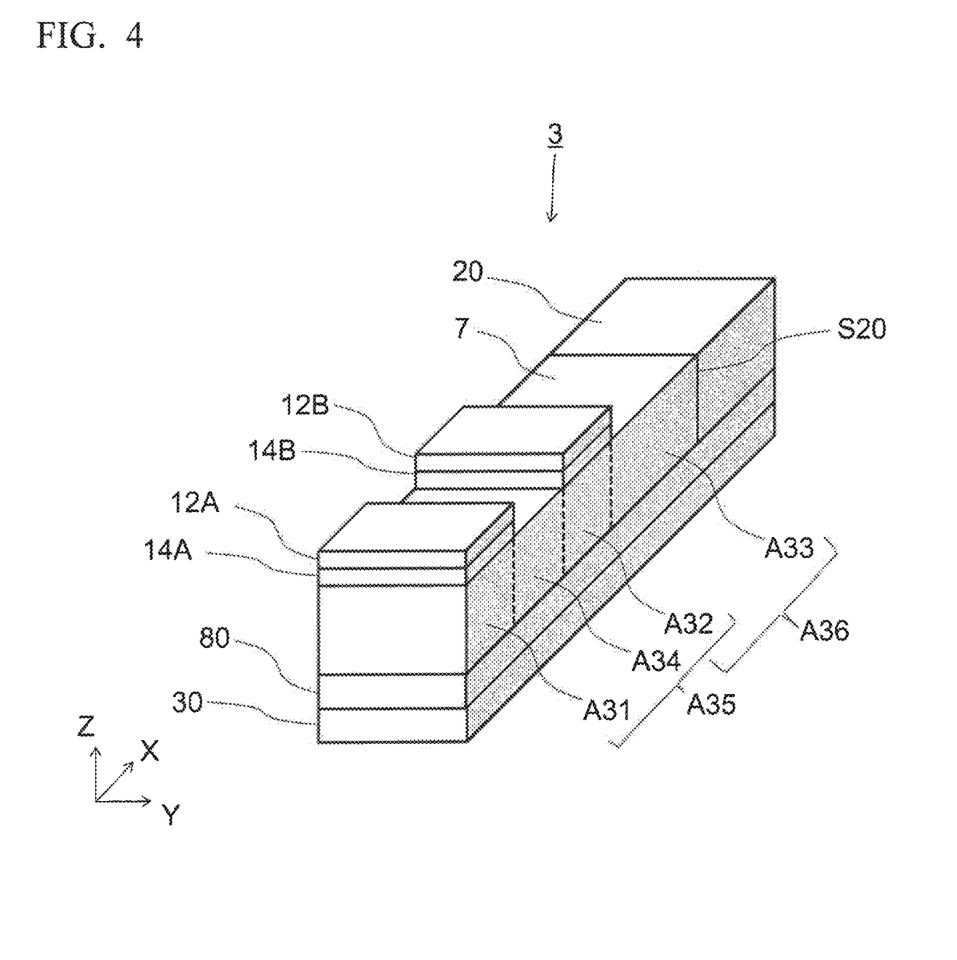
FIG. 4 is a perspective view of a magnetoresistive element according to a third embodiment.

The magnetoresistive element 3 differs from the magnetoresistive element 1 according to the first embodiment in the position of a reference electrode 20. As shown in FIG. 4, in the magnetoresistive element 3, the reference electrode 20 is placed on a side surface S20 of a channel layer 7 so as to be apart from a first ferromagnetic layer 12A and a second ferromagnetic layer 12B and is electrically connected to the first ferromagnetic layer 12A and the second ferromagnetic layer 12B through the channel layer 7.

The channel layer 7 includes a first region A31 that overlaps the first ferromagnetic layer 12A when viewed in a thickness direction of the channel layer 7, a second region A32 that overlaps the second ferromagnetic layer 12B when viewed in the thickness direction of the channel layer 7, a third region A33 located between the second region A32 and the side surface S20 on which the reference electrode 20 is placed, and a fourth region A34 located between the first region A31 and the second region A32. In the channel layer 7, the second region A32 is located between the first region A31 and the third region A33. In the magnetoresistive element 3, a base material making up the channel layer 7 is common among the first to fourth regions A31 to A34 (the first region A31, the second region A32, the third region A33, and the fourth region A34) (common between a fifth region A35 and a sixth region A36) and the average impurity concentration of a fifth region A35 composed of the first region A31, the second region A32, and the fourth region A34 is lower than the average impurity concentration of a sixth region A36 composed of the second region A32 and the third region A33. This allows the average resistivity of the fifth region A35 to be higher than the average resistivity of the sixth region A36. In particular, the average impurity concentration of the first region A31, the average impurity concentration of the second region A32, and the average impurity concentration of the fourth region A34 are lower than the average impurity concentration of the third region A33 and the average resistivity of the first region A31, the average resistivity of the second region A32, and the average resistivity of the fourth region A34 are higher than the average resistivity of the third region A33.

The first region A31 corresponds to the first region A1 of the magnetoresistive element 1 according to the first embodiment. The second region A32 corresponds to the second region A2 of the magnetoresistive element 1 according to the first embodiment. The fourth region A34 corresponds to the fourth region A4 of the magnetoresistive element 1 according to the first embodiment. The fifth region A35 corresponds to the sixth region A6 of the magnetoresistive element 1 according to the first embodiment. The third region A33 corresponds to the third region A3 and fifth region A5 of the magnetoresistive element 1 according to the first embodiment. The sixth region A36 corresponds to the seventh region A7 of the magnetoresistive element 1 according to the first embodiment. Other components of the magnetoresistive element 3 are the same as those of the magnetoresistive element 1 according to the first embodiment.

In the magnetoresistive element 3, the average resistivity of the fifth region A35 is higher than the average resistivity of the sixth region A36. Thus, the ratio of the resistivity of the fifth region A35, which is a spin transport path, to the resistivity of the sixth region A36 increases and the ratio of the resistance of the sixth region A36, which is a spin detection path, to the resistance of the fifth region A35 decreases as compared to the case where the average resistivity of the fifth region A35 is equal to the average resistivity of the sixth region A36. In common with the magnetoresistive element 1 according to the first embodiment, as the resistivity of the fifth region A35, which is the spin transport path, is higher, an output signal is larger. As the resistance of the sixth region A36, which is the spin detection path, is lower, output noise is smaller. Therefore, the magnetoresistive element 3 is capable of having a high S/N ratio.

In the third embodiment, the following example has been described: an example in which the first ferromagnetic layer 12A and the second ferromagnetic layer 12B are placed on the upper surface side of the channel layer 7. At least one of the first ferromagnetic layer 12A and the second ferromagnetic layer 12B may be placed on the lower surface side of the channel layer 7.

Fourth Embodiment

A magnetoresistive element 4 according to a fourth embodiment is described below. Differences from the magnetoresistive element 3 according to the third embodiment are mainly described and common items will not be described in detail.

Figure 5:
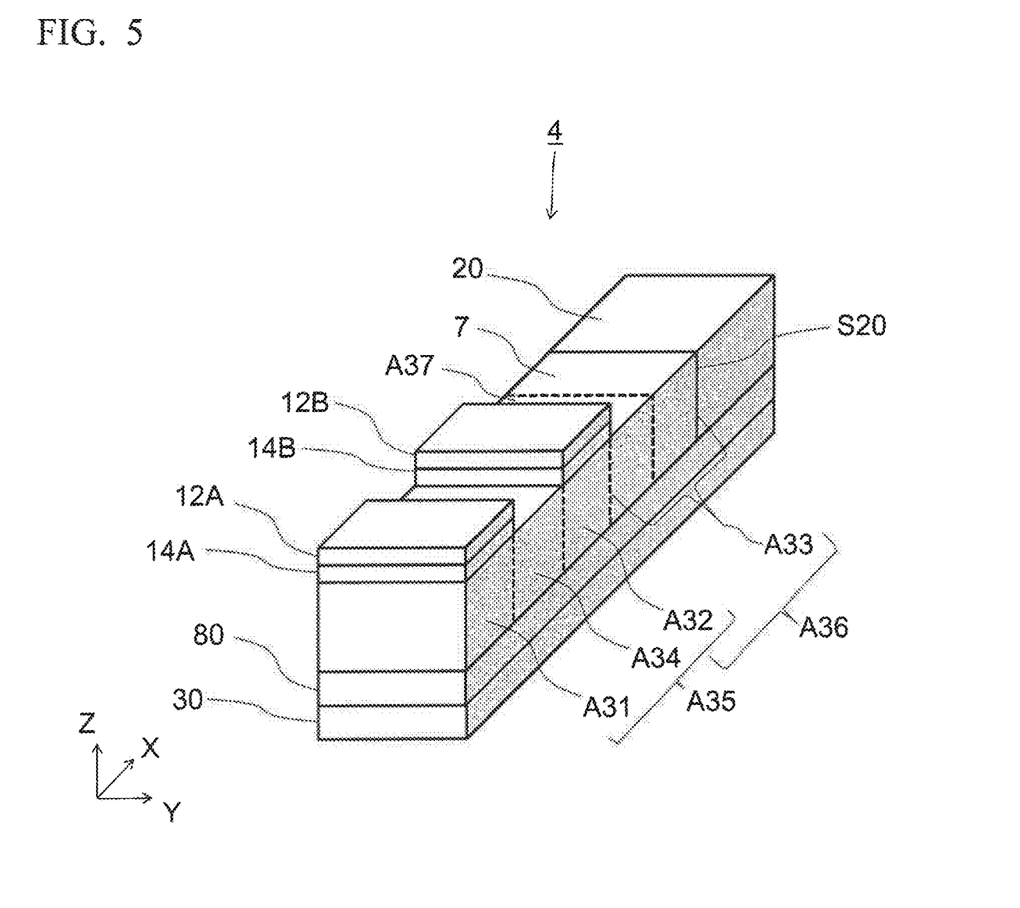
FIG. 5 is a perspective view of a magnetoresistive element according to a fourth embodiment.

The magnetoresistive element 4 differs from the magnetoresistive element 3 according to the third embodiment in the configuration of a third region A33. As shown in FIG. 5, the magnetoresistive element 4 includes a seventh region A37 in the third region A33, the average resistivity of the seventh region A37 being higher than the average resistivity of a sixth region A36. The average impurity concentration of the seventh region A37 is lower than the average impurity concentration of the sixth region A36. As shown in FIG. 5, in the magnetoresistive element 4, the second region A32 is in contact with the seventh region A37. Other components of the magnetoresistive element 4 are same as those of the magnetoresistive element 3 according to the third embodiment.

The preparation of the magnetoresistive element 4 is described. In common with the magnetoresistive element 2 according to the second embodiment, for example, a channel layer 7 is prepared in such a manner that upper portions of regions of a nonmagnetic semiconductor layer, the regions corresponding to a fifth region A35 (a first region A31, the second region A32, and a fourth region A34) and the seventh region A37, are covered with a masking material such as a photoresist and a portion of the nonmagnetic semiconductor layer that is not covered by the masking material is additionally doped with an impurity, whereby the magnetoresistive element 4 can be prepared.

In the channel layer 7, the average resistivity (or impurity concentration) of the first region A31, the average resistivity (or impurity concentration) of the second region A32, the average resistivity (or impurity concentration) of the fourth region A34, and the average resistivity (or impurity concentration) of the seventh region A37 are substantially equal to each other.

The magnetoresistive element 4 includes the seventh region A37, of which the average resistivity is higher than the average resistivity of the sixth region A36, in the third region A33 as described above. Spins accumulated in the second region A32 have the property of diffusing in a region with low resistivity. Since the seventh region A37 functions as a portion suppressing the diffusion of spins, the seventh region A37 can suppress the diffusion of the spins accumulated in the second region A32 in the direction from the second region A32 to the third region A33 and can densely accumulate spins in the second region A32. As a result, an output signal of the magnetoresistive element 4 can be increased.

Furthermore, in the magnetoresistive element 4, the second region A32 is in contact with the seventh region A37 and therefore the effect of suppressing the diffusion of the spins accumulated in the second region A32 in the direction from the second region A32 to the third region A33 by the seventh region A37 can be further increased. Thus, an output signal of the magnetoresistive element 4 can be further increased.

In the magnetoresistive element 4, the whole of a region excluding the seventh region A37 from the third region A33 is additionally doped with the impurity and therefore these regions have low resistivity (high impurity concentration). For example, only a portion of the region excluding the seventh region A37 from the third region A33 may be additionally doped with the impurity such that this portion has low resistivity (high impurity concentration).

In the magnetoresistive element 4, the second region A32 is in contact with the seventh region A37. The second region A32 may be apart from the seventh region A37. Even in this case, the effect of suppressing the diffusion of the spins accumulated in the second region A32 in the direction from the second region A32 to the third region A33 by the seventh region A37 is obtained and an output signal of the magnetoresistive element 4 can be increased.

Fifth Embodiment

Figure 6:
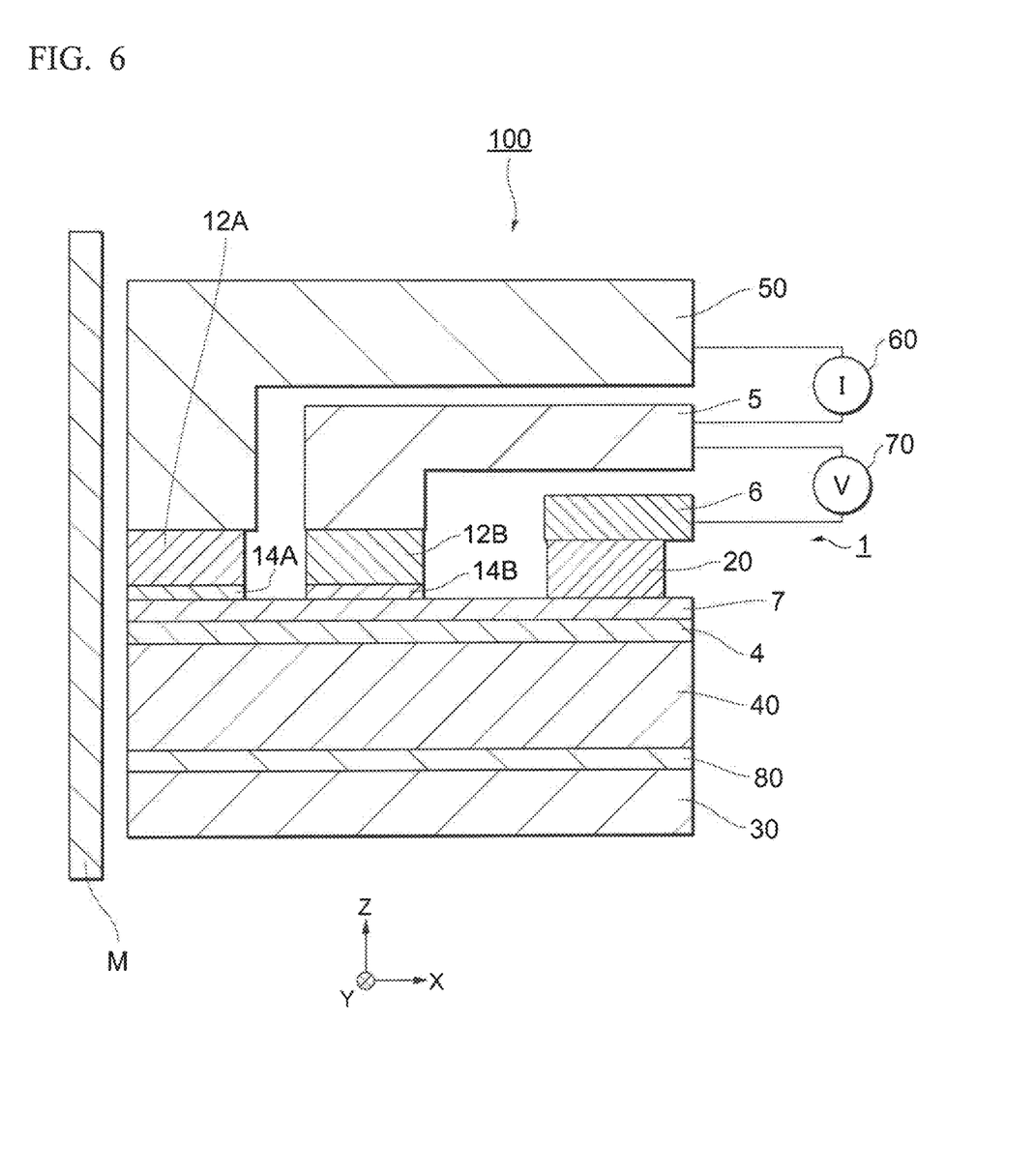
FIG. 6 is a substantial sectional view of a magnetic sensor according to a fifth embodiment.
Figure 7:
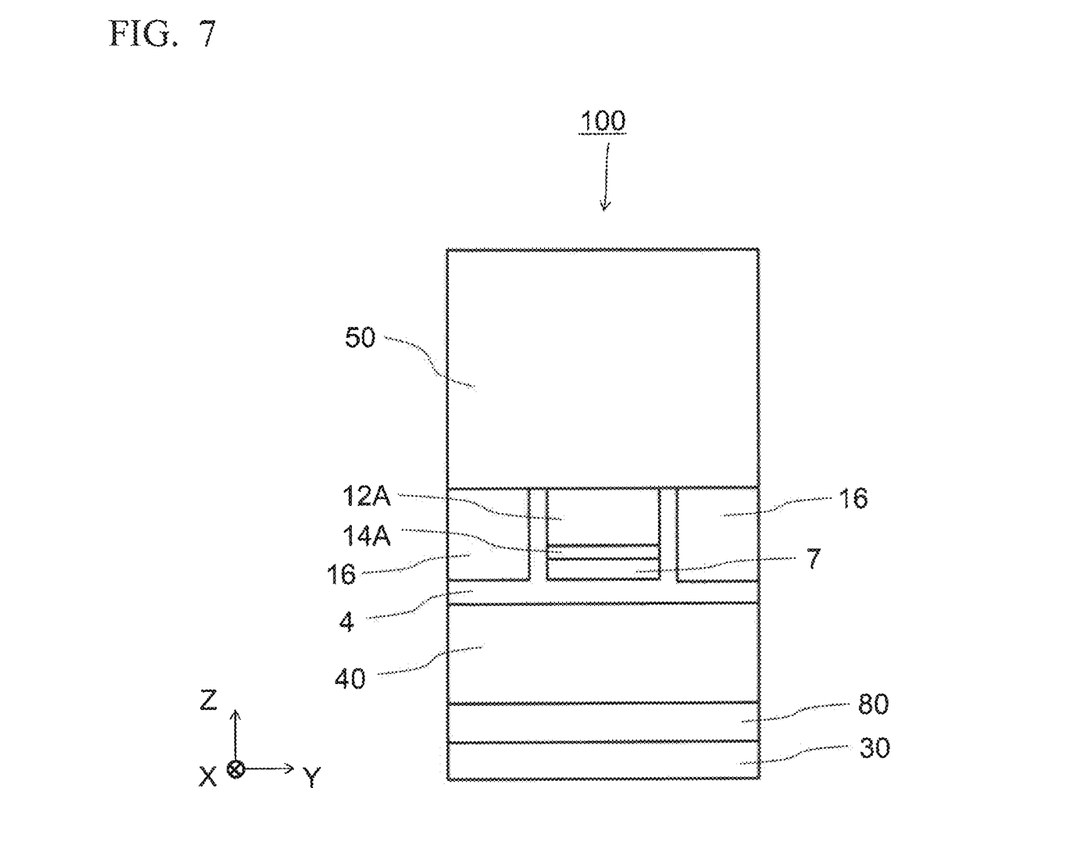
FIG. 7 is a side view of the magnetic sensor viewed from a magnetic medium (an X-direction) shown in FIG. 6.

A magnetic sensor 100 according to a fifth embodiment is described below. FIG. 6 is a substantial sectional view of the magnetic sensor 100. FIG. 7 is a side view of the magnetic sensor 100 viewed from a magnetic medium M shown in FIG. 6 (a side view viewed in an X-direction). As shown in FIGS. 6 and 7, the magnetic sensor 100 includes the magnetoresistive element 1 placed above the support substrate 30 with the base insulating layer 80 therebetween, a lower magnetic shield 40, and an upper magnetic shield 50, the lower magnetic shield 40 and the upper magnetic shield 50 being placed so as to sandwich the magnetoresistive element 1 in a direction (a Z-direction) orthogonal to a film surface. As shown in FIG. 7, the magnetic sensor 100 includes bias magnetic field application layers 16 placed on both sides of the magnetoresistive element 1 in a Y-direction (a direction orthogonal to a sheet surface in FIG. 6) that is a width direction of the magnetoresistive element 1. An insulating layer 4 extends between the magnetoresistive element 1 and the lower magnetic shield 40 and between the magnetoresistive element 1 and the bias magnetic field application layers 16. The insulating layer 4 is placed for the purpose of insulating and isolating the magnetoresistive element 1 from the lower magnetic shield 40 and the bias magnetic field application layers 16 and for the purpose of suppressing the absorption of spins by the lower magnetic shield 40, the bias magnetic field application layers 16, and the like. The bias magnetic field application layers 16 apply a bias magnetic field to the first ferromagnetic layer 12A in the Y-direction for the purpose of making the first ferromagnetic layer 12A a single magnetic domain. A material making up the insulating layer 4 is preferably, for example, $Al_2O_3$, $SiO_2$, or the like. A material making up the bias magnetic field application layers 16 is preferably, for example, Co—Pt, Co—Cr—Pt, or the like. A material making up the lower and upper magnetic shields 40 and 50 is preferably, for example, Ni—Fe or the like.

As shown in FIG. 6, the upper magnetic shield 50 is placed on an upper portion of the first ferromagnetic layer 12A. A first wiring line 5 is placed on an upper portion of the second ferromagnetic layer 12B. A second wiring line 6 is placed on an upper portion of the reference electrode 20. The upper magnetic shield 50 also serves as a wiring line for applying a current to the magnetoresistive element 1. A material making up the first and second wiring lines 5 and 6 may be the same as the material making up the upper magnetic shield 50. A current source 60 is connected between the upper magnetic shield 50 and the first wiring line 5 such that a current is applied between the first ferromagnetic layer 12A and the second ferromagnetic layer 12B through the channel layer 7. A voltmeter 70 is connected between the first wiring line 5 and the second wiring line 6 such that a voltage is detected between the second ferromagnetic layer 12B and the reference electrode 20.

The magnetic sensor 100 is described using an example in which the magnetic field generated from the magnetic medium M is detected as a detected external magnetic field. As shown in FIG. 6, in the magnetic sensor 100, a tip portion of the magnetoresistive element 1 (an end of the first ferromagnetic layer 12A) is placed in a surface of the magnetic sensor 100 that faces the magnetic medium M. In the magnetic sensor 100, the first ferromagnetic layer 12A functions as a layer (magnetization free layer) of which the magnetization direction varies depending on the magnetic field generated from the magnetic medium M. The first ferromagnetic layer 12A is made of a soft magnetic material. The surface of the magnetic sensor 100 that faces the magnetic medium M is preferably covered with a protective film made of diamond-like carbon (DLC). In FIGS. 6 and 7, the protective film is not shown.

As shown in FIG. 6, in the magnetic sensor 100, the second ferromagnetic layer 12B is placed in a position apart from the magnetic medium M. Therefore, the second ferromagnetic layer 12B is unlikely to be affected by the magnetic field generated from the magnetic medium M and therefore functions as a layer (magnetization-fixed layer) of which the magnetization direction is fixed in one direction. In order to more tightly fix the magnetization of the second ferromagnetic layer 12B (in order to increase the coercive force of the second ferromagnetic layer 12B), shape anisotropy may be imparted to the second ferromagnetic layer 12B. Alternatively, exchange coupling acting between the second ferromagnetic layer 12B and an antiferromagnetic layer may be used by stacking the antiferromagnetic layer on the second ferromagnetic layer 12B. Alternatively, exchange coupling acting in the second ferromagnetic layer 12B may be used by converting the second ferromagnetic layer 12B into a synthetic pinned structure.

The magnetic field generated from the magnetic medium M can be detected in such a manner that a current is applied between the first ferromagnetic layer 12A and the second ferromagnetic layer 12B through the channel layer 7 and the voltage between the second ferromagnetic layer 12B and the reference electrode 20 is measured. The relative angle between the magnetization direction of the first ferromagnetic layer 12A and the magnetization direction of the second ferromagnetic layer 12B varies depending on the change of the magnetic field generated from the magnetic medium M and the voltage between the second ferromagnetic layer 12B and the reference electrode 20 varies.

The magnetic sensor 100 includes the magnetoresistive element 1, which can provide a high S/N ratio, and therefore can accurately detect an external magnetic field.

In the fifth embodiment, the magnetic sensor 100 is an example in which the first ferromagnetic layer 12A is placed so as to face the magnetic medium M and functions as a magnetization free layer. The second ferromagnetic layer 12B may be allowed to function as a magnetization free layer in such a manner that a magnetoresistive element including a channel layer 7 having a shape (for example, an L-shape or a T-shape) with a bent portion like the above-mentioned magnetoresistive element 1a is used and the second ferromagnetic layer 12B is placed so as to face the magnetic medium M.

In the fifth embodiment, the magnetic sensor 100 is an example in which the first ferromagnetic layer 12A, the second ferromagnetic layer 12B, and the reference electrode 20 are placed on the upper surface side of the channel layer 7. At least one of the second ferromagnetic layer 12B and the reference electrode 20 may be placed on the lower surface side of the channel layer 7. In this case, the lower magnetic shield 40 can be substituted for one of the first and second wiring lines 5 and 6.

In the fifth embodiment, the magnetic sensor 100 is an example that includes the magnetoresistive element 1. The magnetoresistive element 1a, the magnetoresistive element 2, the magnetoresistive element 3, or the magnetoresistive element 4 may be used instead of the magnetoresistive element 1.

What is claimed is:

1. A magnetoresistive element comprising:
a channel layer;
a first ferromagnetic layer;
a second ferromagnetic layer; and
a reference electrode,
wherein the first ferromagnetic layer, the second ferromagnetic layer, and the reference electrode are apart from each other and are electrically connected to each other through the channel layer; the first ferromagnetic layer, the second ferromagnetic layer, and the reference electrode do not overlap each other and are apart from each other when viewed in a thickness direction of the channel layer; the channel layer includes a first region that overlaps the first ferromagnetic layer when viewed in the thickness direction, a second region that overlaps the second ferromagnetic layer when viewed in the thickness direction, a third region that overlaps the reference electrode when viewed in the thickness direction, a fourth region located between the first region and the second region, and a fifth region located between the second region and the third region; the second region is located between the first region and the third region in the channel layer; and an average resistivity of a sixth region composed of the first region, the second region, and the fourth region is higher than an average resistivity of a seventh region composed of the second region, the third region, and the fifth region.

2. The magnetoresistive element according to claim 1, further comprising an eighth region in the fifth region, an average resistivity of the eighth region being higher than the average resistivity of the seventh region.

3. The magnetoresistive element according to claim 2, wherein the second region is in contact with the eighth region.

4. A magnetic sensor comprising the magnetoresistive element according to claim 1.

5. A magnetoresistive element comprising:
a channel layer;
a first ferromagnetic layer;
a second ferromagnetic layer; and
a reference electrode,
wherein the first ferromagnetic layer and the second ferromagnetic layer are apart from each other and are electrically connected to each other through the channel layer; the reference electrode is placed on a side surface of the channel layer so as to be apart from the first ferromagnetic layer and the second ferromagnetic layer and is electrically connected to the first ferromagnetic layer and the second ferromagnetic layer through the channel layer; the first ferromagnetic layer, the second ferromagnetic layer, and the reference electrode do not overlap each other and are apart from each other when viewed in a thickness direction of the channel layer; the channel layer includes a first region that overlaps the first ferromagnetic layer when viewed in the thickness direction, a second region that overlaps the second ferromagnetic layer when viewed in the thickness direction, a third region located between the second region and the side surface on which the reference electrode is placed, and a fourth region located between the first region and the second region; the second region is located between the first region and the third region in the channel layer; and an average resistivity of a fifth region composed of the first region, the second region, and the fourth region is higher than an average resistivity of a sixth region composed of the second region and the third region.

6. The magnetoresistive element according to claim 5, further comprising a seventh region in the third region, an average resistivity of the seventh region being higher than the average resistivity of the sixth region.

7. The magnetoresistive element according to claim 6, wherein the second region is in contact with the seventh region.

8. A magnet sensor comprising the magnetoresistive element according to claim 5.

* * * * *